United States Patent
Cheng et al.

(10) Patent No.: US 11,183,581 B2
(45) Date of Patent: Nov. 23, 2021

(54) VERTICAL FIELD EFFECT TRANSISTOR HAVING IMPROVED UNIFORMITY

(71) Applicant: International Business Machines Corporation, Armonk, NY (US)

(72) Inventors: Kangguo Cheng, Schenectady, NY (US); Juntao Li, Cohoes, NY (US); Ruilong Xie, Niskayuna, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 16/581,867

(22) Filed: Sep. 25, 2019

(65) Prior Publication Data

US 2020/0266288 A1    Aug. 20, 2020

Related U.S. Application Data

(62) Division of application No. 16/280,326, filed on Feb. 20, 2019, now Pat. No. 10,522,658.

(51) Int. Cl.
    *H01L 29/66*          (2006.01)
    *H01L 29/78*          (2006.01)
    *H01L 29/08*          (2006.01)

(52) U.S. Cl.
    CPC .... *H01L 29/66666* (2013.01); *H01L 29/0847* (2013.01); *H01L 29/6656* (2013.01); *H01L 29/66553* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 9,646,885 | B1 | 5/2017 | Pranatharthiharan et al. |
| 9,755,073 | B1 | 9/2017 | Cheng et al. |
| 9,806,153 | B1 | 10/2017 | Cheng et al. |
| 9,881,937 | B2 | 1/2018 | Cheng et al. |
| 9,984,893 | B2 | 5/2018 | Cheng et al. |
| 10,002,795 | B1 | 6/2018 | Bi et al. |

(Continued)

OTHER PUBLICATIONS

Notice of Allowance for U.S. Appl. No. 16/280,326 dated Aug. 23, 2019.
List of IBM Patents or Patent Applications Treated as Related.

*Primary Examiner* — Jack S Chen
(74) *Attorney, Agent, or Firm* — Fleit Intellectual Property Law; Thomas S. Grzesik

(57) ABSTRACT

A semiconductor device structure and method for fabricating the same. The semiconductor device structure includes a semiconductor fin and a liner in contact with end portions of the semiconductor fin. A first source/drain contacts the liner and sidewalls of the semiconductor fin. A gate structure is in contact with and surrounds the semiconductor fin. A second source/drain is formed above the first source/drain. The method includes forming, on a substrate, at least one semiconductor fin having a first spacer in contact with an upper portion of the semiconductor fin, and a second spacer in contact with the first spacer and a lower portion of the semiconductor fin. The semiconductor fin is patterned into a plurality of semiconductor fins. A liner is formed on exposed end portions of each semiconductor fin of the plurality of semiconductor fins.

20 Claims, 16 Drawing Sheets

(56) References Cited

U.S. PATENT DOCUMENTS

| 10,103,246 | B2 | 10/2018 | Cheng et al. |
| 2017/0330969 | A1 | 11/2017 | Cheng et al. |
| 2018/0374933 | A1 | 12/2018 | Cheng et al. |
| 2020/0266288 | A1* | 8/2020 | Cheng ............. H01L 21/823842 |

* cited by examiner

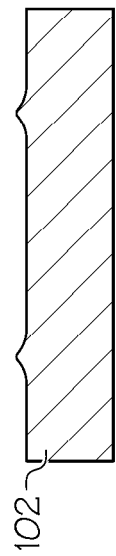
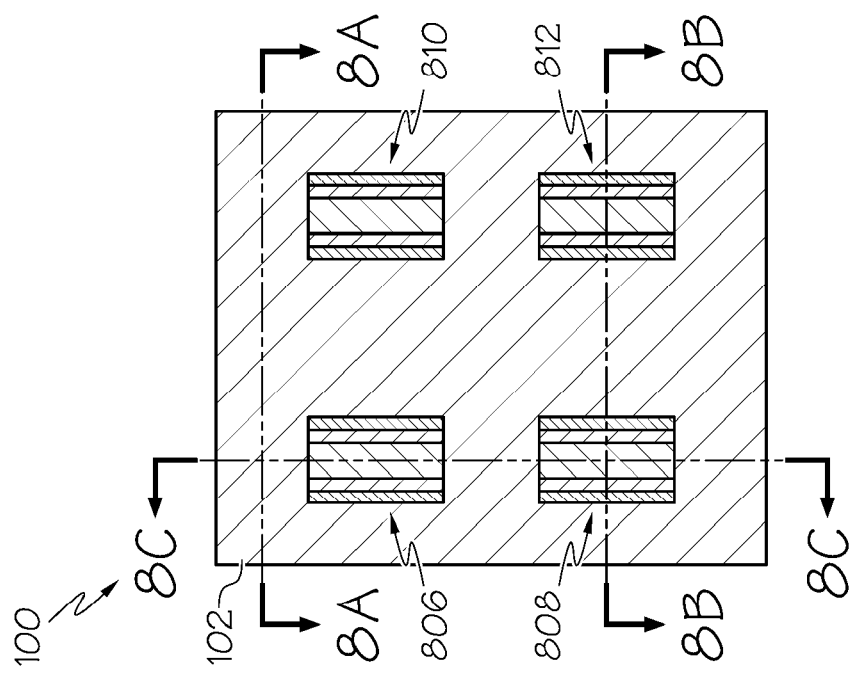

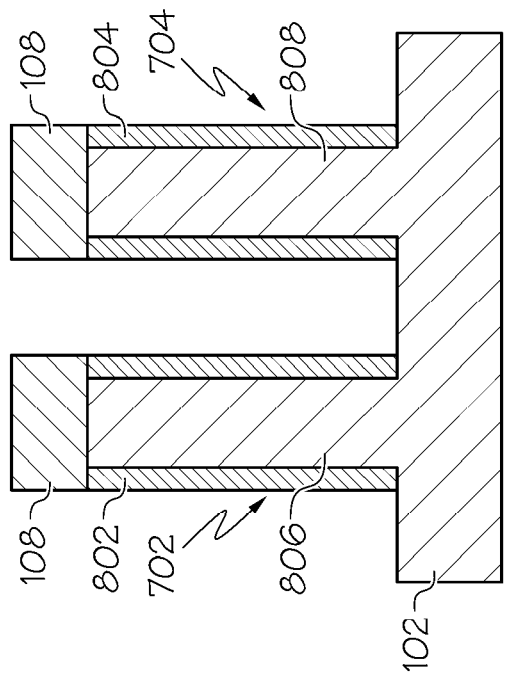
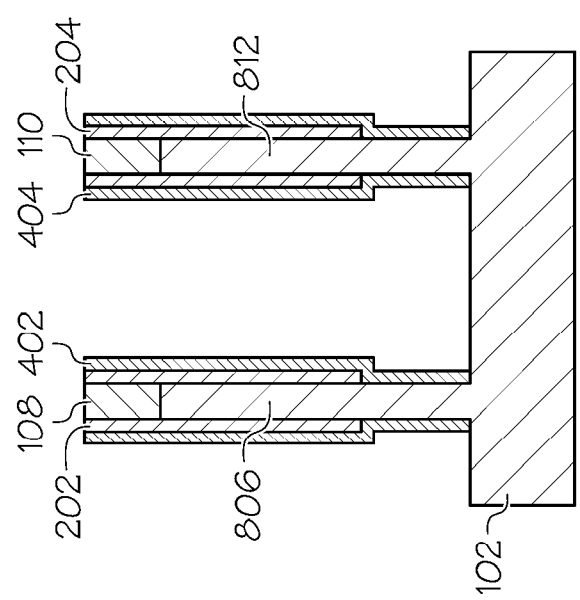
FIG. 8C
FIG. 8B

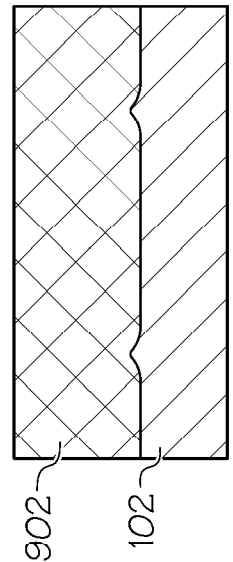
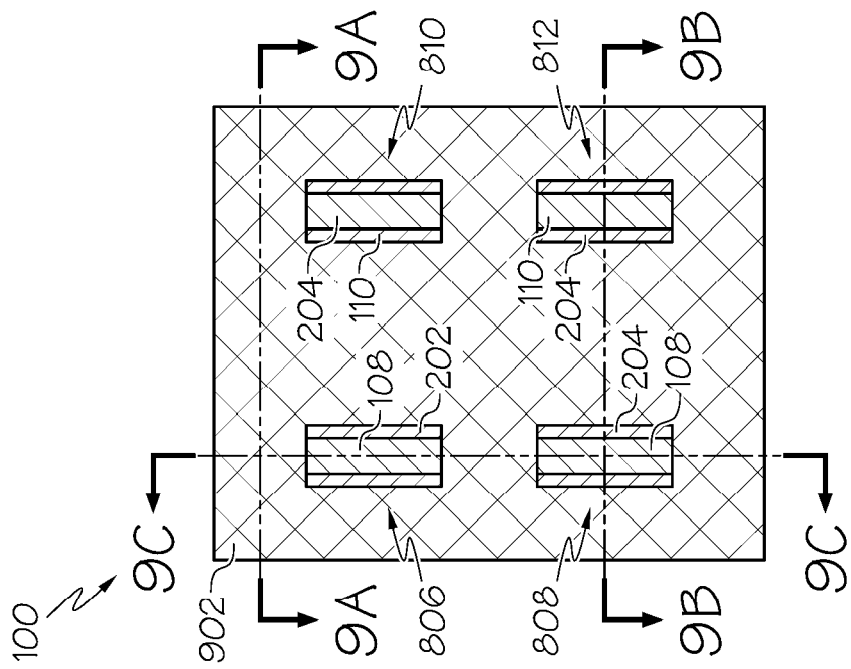
FIG. 9A
FIG. 9

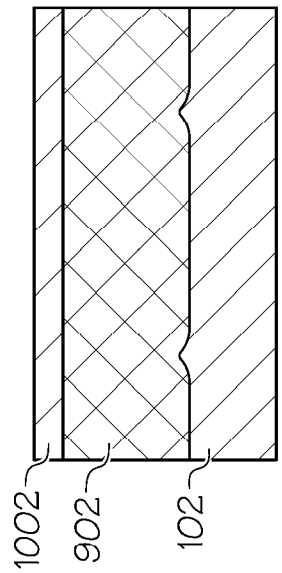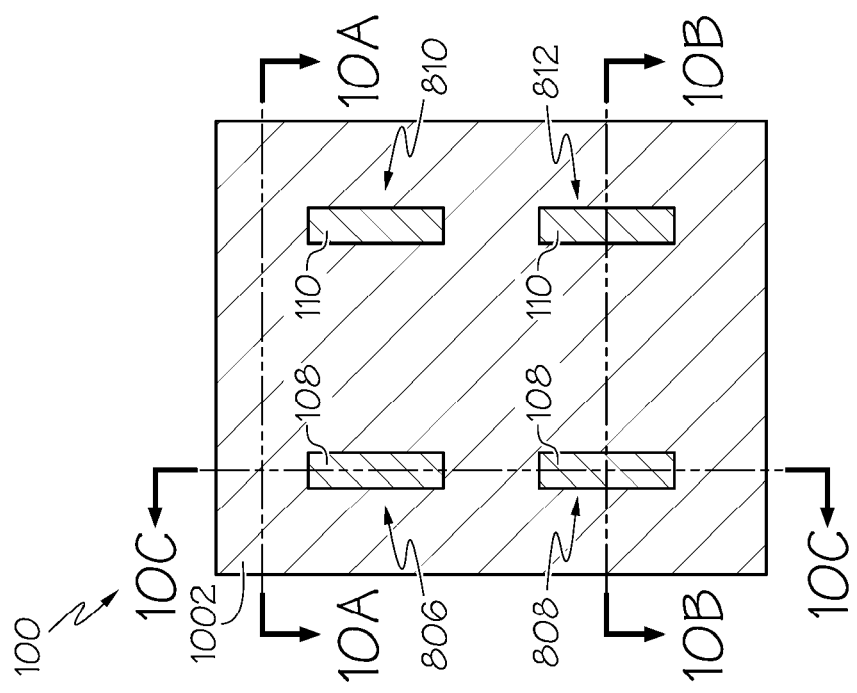

VERTICAL FIELD EFFECT TRANSISTOR HAVING IMPROVED UNIFORMITY

BACKGROUND OF THE INVENTION

The present disclosure generally relates to the field of semiconductors, and more particularly relates to vertical field effect transistors.

Vertical field effect transistors (VFETs) are becoming viable device options for semiconductor devices, for example, complementary metal oxide semiconductor (CMOS) devices, beyond 5 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch. Vertical transistors may provide higher density scaling and allow for relaxed gate lengths to better control device electrostatics, without sacrificing the gate contact pitch size.

SUMMARY OF THE INVENTION

In one embodiment, a method a semiconductor device structure is disclosed. The method comprises forming, on a substrate, at least one semiconductor fin comprising a first spacer in contact with an upper portion of the semiconductor fin, and a second spacer in contact with the first spacer and a lower portion of the semiconductor fin. The semiconductor fin is patterned into a plurality of semiconductor fins. A liner is formed on exposed end portions of each semiconductor fin of the plurality of semiconductor fins.

In another embodiment, a semiconductor device structure is disclosed. The semiconductor device structure comprises a semiconductor fin and a liner in contact with end portions of the semiconductor fin. A first source/drain contacts the liner and sidewalls of the semiconductor fin. A gate structure is in contact with and surrounds the semiconductor fin. A second source/drain is formed above the first source/drain.

In a further embodiment, an integrated circuit is disclosed. The integrated circuit comprises at least one vertical field effect transistor. The at least one vertical field effect transistor comprises at least the following features. A semiconductor fin and a liner in contact with end portions of the semiconductor fin. A first source/drain contacts the liner and sidewalls of the semiconductor fin. A gate structure is in contact with and surrounds the semiconductor fin. A second source/drain is formed above the first source/drain.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 8 is a plain view of the semiconductor device structure after a liner has been formed on end portions of the fins according to one embodiment of the present invention;

FIGS. 8A to 8C are a cross-sectional views of the semiconductor device structure after a liner has been formed on end portions of the fins according to one embodiment of the present invention;

FIG. 9 is a plain view of the semiconductor device structure after the cut mask has been removed and a bottom source/drain has been formed according to one embodiment of the present invention;

FIGS. 9A to 9C are a cross-sectional views of the semiconductor device structure after the cut mask has been removed and a bottom source/drain has been formed according to one embodiment of the present invention;

FIG. 10 is a plain view of the semiconductor device structure after a bottom spacer layer has been formed according to one embodiment of the present invention;

FIGS. 10A to 10C are a cross-sectional views of the semiconductor device structure after a bottom spacer layer has been formed according to one embodiment of the present invention;

DETAILED DESCRIPTION

Figure 1:
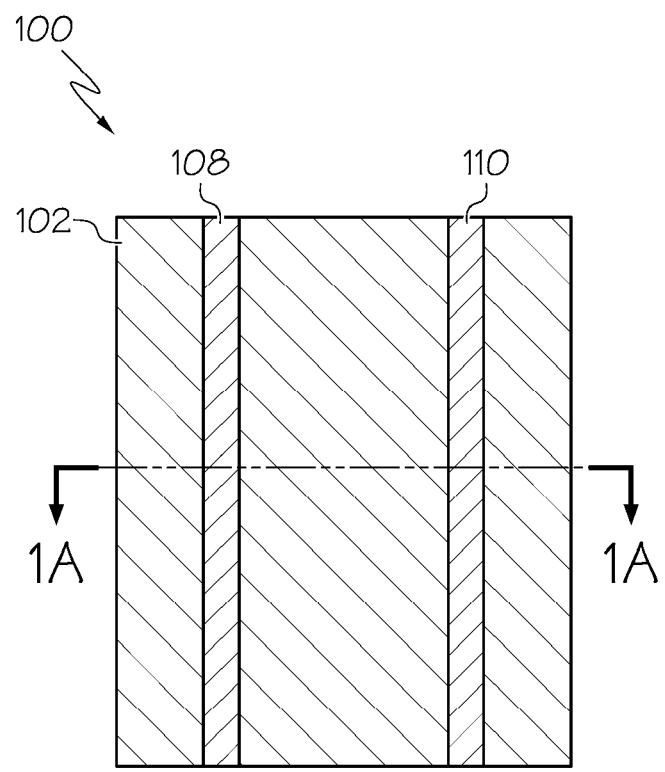
FIG. 1 is a plain view of a semiconductor device structure after a plurality of fins have been formed on a substrate according to one embodiment of the present invention.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

Vertical FETs (VFETs) are being pursued as a viable CMOS architecture beyond the 7 nm node. In a typical VFET integration flow, the bottom source/drain recess is usually performed on segment fin patterns (post cut fin) and suffers severe micro-loading effects. This causes the bottom source/drain recess depth to have non-uniform profiles (e.g., shallower at the center portion between fins and deeper at locations closer to two fin ends). This non-uniform bottom source/drain recess results in bottom source/drain epitaxial growth variations, bottom spacer height variations, and gate length variations.

As will be discussed in greater detail below, one or more embodiments address the above problems by improving bottom source/drain epitaxial growth uniformity and, thus, gate length variation. For example, in one embodiment, a sea of semiconductor fins may be formed. Dielectric spacers may then be formed on fin sidewalls and the fins may then be recessed to expose their bottom portions. Before epitaxially growing the bottom S/D, a series of process steps may be performed so that fins are cut into desired lengths and a second dielectric inner spacer may then be formed to seal the fin ends. The recessed fin bottom portion remains open so that bottom S/D can be epitaxially grown in this region resulting in uniform bottom S/D. The late fin cut prevents reactive ion etch (RIE) loading effects and enables uniform bottom S/D recess for bottom S/D epitaxy growth. Portions of liner at the lower portion of the fin ends help minimize the impact of epitaxial process at fin ends to junction formation and thus improve junction (doping diffusion) uniformity.

FIGS. 1-11B illustrate various processes for improving the uniformity for VFETs according to various embodiments of the present invention. In general, the figures comprise a plain view and various cross-sectional views that are taken where indicated in the plain view. More specifically, some cross-sectional views are taken along a line that passes through a fin; while some cross-sectional views are taken transverse to the long axis of the fins; and other cross-sectional views are taken along a line that is parallel to a fin.

Figure 1A:
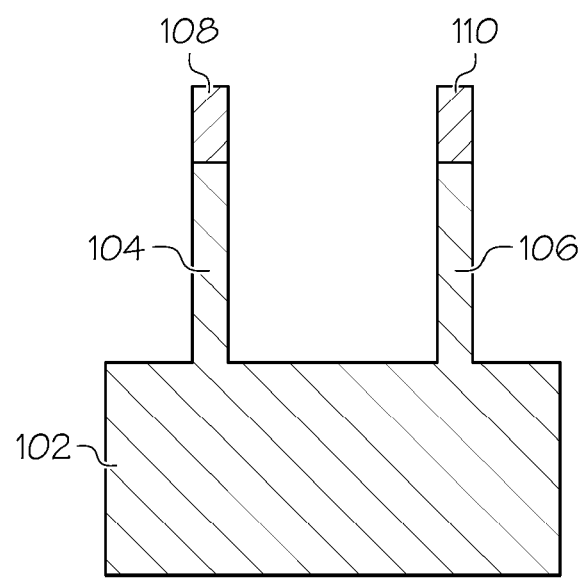
FIG. 1A is a cross-sectional view of the semiconductor device structure after the plurality of fins have been formed on the substrate according to one embodiment of the present invention.

FIGS. 1 and 1A show a semiconductor device structure 100 at a given point in the fabrication process. For example, FIG. 1 shows a substrate 102; a plurality of fin structures 104, 106; and a hard mask 108, 110 formed on and in contact with a top surface of each fin structure 104, 106. In some embodiments, the substrate 102 is a bulk substrate. The structure 100 may comprise fins 104, 160 for PFET devices, NFET devices, or a combination of both. In one embodiment, the substrate 102 comprises entirely of a semiconductor material. The substrate 102 may comprise a single crystalline semiconductor material or a polycrystalline material. In another embodiment, the substrate 102 may include an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material.

The substrate 102 may comprise undoped single crystalline silicon or single crystalline silicon doped with p-type dopant atoms or n-type dopant atoms. Examples of materials for the substrate 102 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in which fins for multi-gate devices can be formed. In other embodiments, the substrate 102 is formed on and in contact with a handle substrate or an insulating layer disposed in contact with a handle substrate. In this embodiment, the handle substrate includes similar materials to those discussed above.

Doping of the substrate 102 (or other semiconductor layer from which the fins 104 106 are formed) may be performed using, for example, ion implantation, or annealing if not using an epitaxial process. In a non-limiting illustrative example, the doping utilizes, for example, arsenic (As) or phosphorous (P) for n-type device, and boron (B) for a p-type device, at concentrations in the general range of, for example, $e20/cm^3$.

In other embodiments, the substrate 102 is a silicon-on-insulator (SOI) substrate. In this example, an optional dielectric layer (e.g., a BOX layer or oxide layer) overlies the substrate, and the fin structures 104, 106 are formed on and in contact with the dielectric layer. The optional dielectric layer may be formed from any of several dielectric materials. Non-limiting examples include, for example, oxides, nitrides and oxynitrides of silicon. The dielectric layer may also include oxides, nitrides and oxynitrides of elements other than silicon. In addition, the dielectric layer may include crystalline or non-crystalline dielectric material. Moreover, the dielectric layer may be formed using any of several methods. Non-limiting examples include ion implantation methods, thermal or plasma oxidation or nitridation methods, chemical vapor deposition methods and physical vapor deposition methods. The dielectric layer may include a thickness ranging from about 5 nm to about 200 nm. In one embodiment, the dielectric layer may be about 25 nm thick. In an embodiment where the fins structures are formed on an SOI substrate, the fin structures and the substrate can be made of the same or different materials.

In an SOI embodiment, the semiconductor material/layer from which the fin structures 104, 106 are fabricated may be formed utilizing various methods such as a layer transfer process including a bonding step, or an implantation process such as SIMOX (Separation by IMplantation of OXygen). This semiconductor material/layer nay be undoped or doped with either p-type or n-type dopants through ion implantation, plasma doping, or gas phase doping. P-type transistors are produced by doping the semiconductor material/layer with elements from group III of the periodic table (e.g., boron, aluminum, gallium, or indium). As an example, the dopant can be boron in a concentration ranging from 1×10E18 atoms/cm3 to 2×10E21 atoms/cm3. N-type transistors are produced by doping the semiconductor material/layer with elements from group V of the periodic table (e.g., phosphorus, antimony, or arsenic).

The fin structures 104, 106 may be formed by forming an etch-stop hard mask onto the substrate 102 (or semiconductor layer) through, for example, deposition. The etch-stop hard mask may be made of, for example, silicon oxide, silicon oxynitride, silicon carbide, silicon oxycarbide, silicon nitride, titanium nitride, tetraethyl orthosilicate, a combination thereof, and/or other materials suitable in providing etch-stop function. The fin structures 104, 106 are subsequently formed or etched out of the substrate 102 (or the semiconductor layer) through a process involving masking, using industry-standard lithographic techniques, and directionally etching (e.g., RIE) the etch-stop capping layer and underneath semiconductor layer (or substrate 102). After the RIE etching process, the photo-resist mask used in the lithographic etching process may be removed, leaving the fin structures 104, 106 and hard masks 108, 110. In some embodiments, there may be different pitches between two or more of the fin structures to define different devices.

Figure 2:
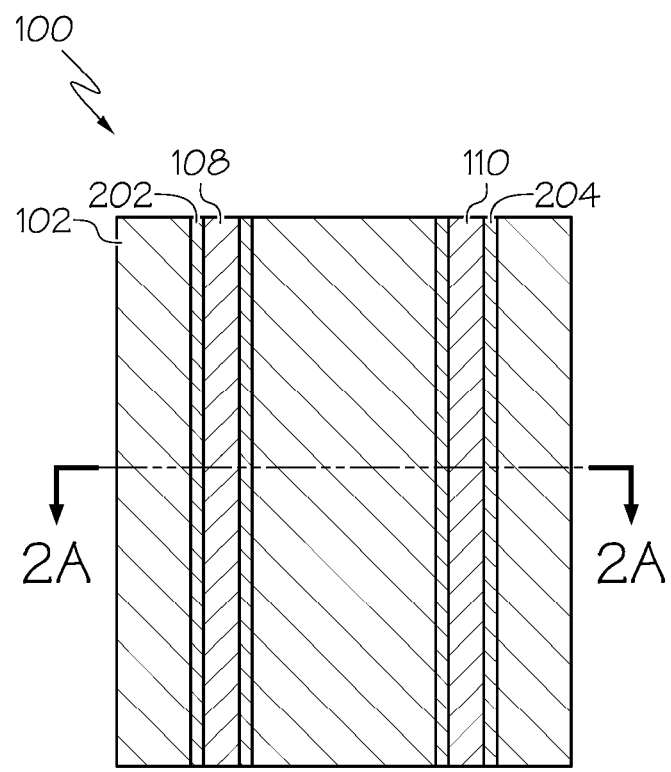
FIG. 2 is a plain view of the semiconductor device structure after a first spacer has been formed in contact with each of the fins according to one embodiment of the present invention.
Figure 2A:
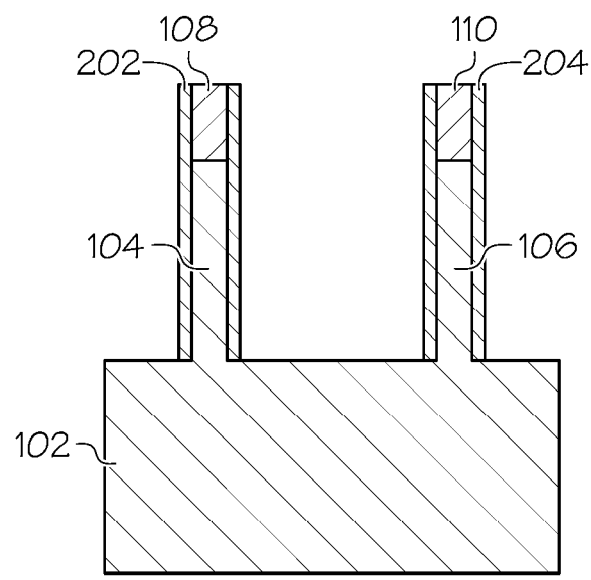
FIG. 2A is a cross-sectional view of the semiconductor device structure after the first spacer has been formed in contact with each of the fins according to one embodiment of the present invention.

FIGS. 2 and 2A show that a first spacer/liner 202, 204 is formed on the sidewalls of the fins 104, 106. The first spacer 202, 204 may be formed by one or more spacer formation techniques. For example, the first spacer 202, 204 may be formed by isotropically depositing a conformal layer of insulating material (e.g., SiN, silicon boron nitride, silicon-borocarbonitride or some other dielectric) followed by an anisotropic etch (e.g., reactive ion etch (RIE)) of that material to form spacers only on the sidewalls of the fins 104, 106

Figure 3:
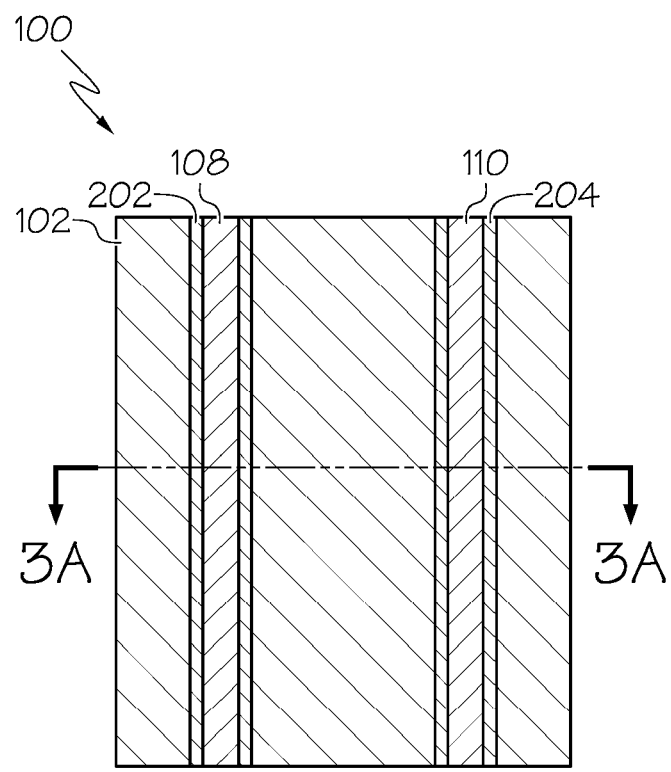
FIG. 3 is a plain view of the semiconductor device structure after the substrate has been recessed according to one embodiment of the present invention.
Figure 3A:
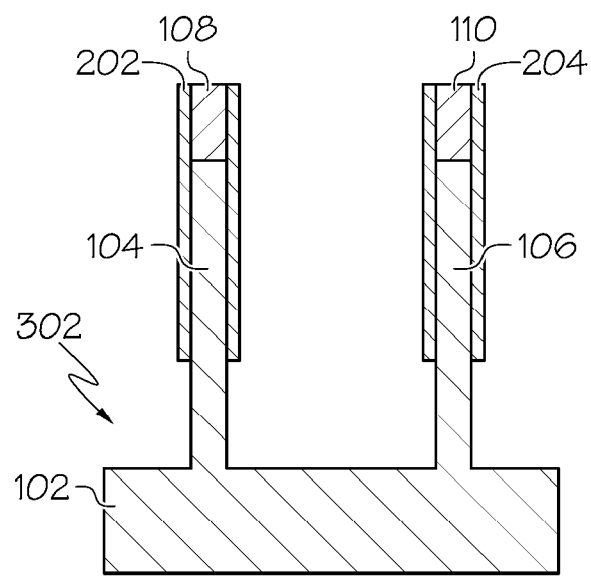
FIG. 3A is a cross-sectional view of the semiconductor device structure after the substrate has been recessed according to one embodiment of the present invention.

After the first spacer 202, 204 has been formed, the substrate 102 may then recessed to form a bottom source/drain recess 302 as shown in FIGS. 3 and 3A. The substrate 102 may be recessed using, for example, directional RIE. A lateral may also be performed to trim the fin bottom. Since there is no fin cut prior to the bottom source/drain recess, loading effect during the recess process is prevented (e.g., the bottom surface in the source/drain recess region is substantially at the same level).

Figure 4:
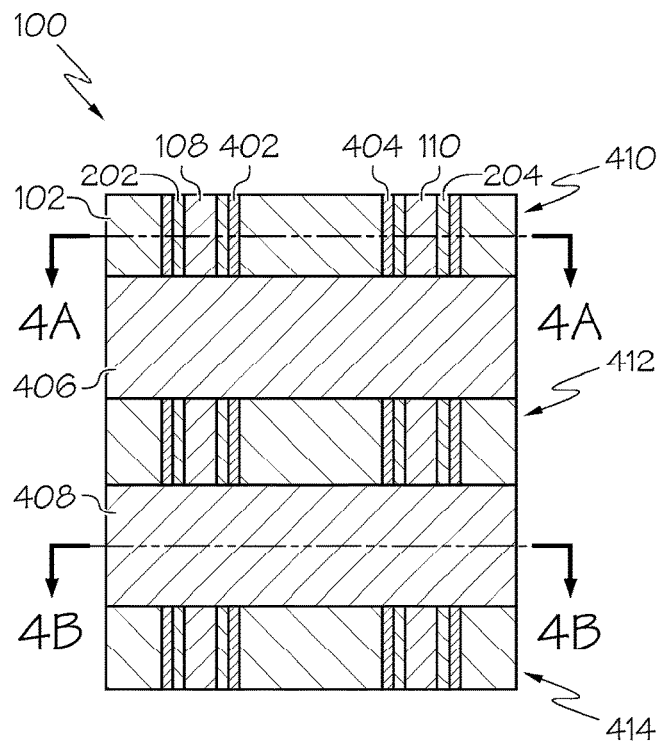
FIG. 4 is a plain view of the semiconductor device structure after a cut mask and a second spacer have been formed according to one embodiment of the present invention.
Figure 4A:
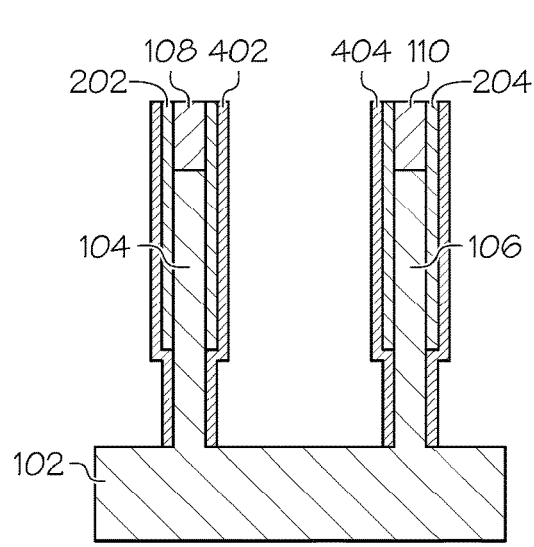
FIGS. 4A and 4B are cross-sectional views of the semiconductor device structure after the cut mask and the second spacer have been formed according to one embodiment of the present invention.
Figure 4B:
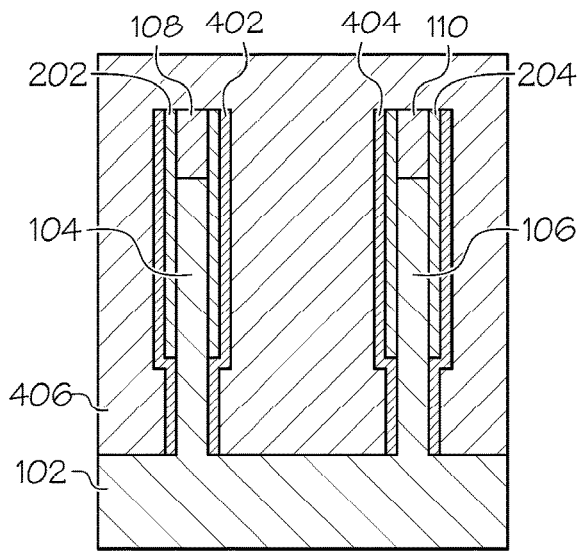

FIGS. 4 and 4B show that a second spacer/liner 402, 404 may then be formed on and in contact with the sidewalls of the first spacer 202, 204 and portions of the fin sidewalls exposed/formed by the bottom source/drain recess process. The second spacer 402, 404 may be formed by isotropically depositing a conformal layer of insulating material (e.g., silicon oxide, silicon oxycarbid, silicon oxycarbonitride or some other dielectric silicon oxynitride, and the like) followed by an anisotropic etch (e.g., reactive ion etch (RIE)) of that material to form spacers only on the sidewalls of the first spacer 202, 204 and the lower portions of the fin sidewalls. In one example, the first spacer 202, 204 may comprise nitride and the second spacer 402, 404 may comprise an oxide. However, other materials are applicable as well. In addition, the first and second spacers may be interchangeable as long as they have etch selectivity.

After formation of the second spacer 402, 404 a fin cut mask 406, 408 is formed over one or more regions of the structure 100. The fin cut mask 406, 408 defines one or more fin cut regions 410 to 414 comprising exposed portions of the fin structures 104, 106 to be cut (FIG. 4A). The fin cut mask 406, 408 mask may be formed by depositing one or more patterning materials such as silicon nitride, silicon oxide, resist material, polysilicon, and/or the like and performing one or more patterning processes.

Figure 5:
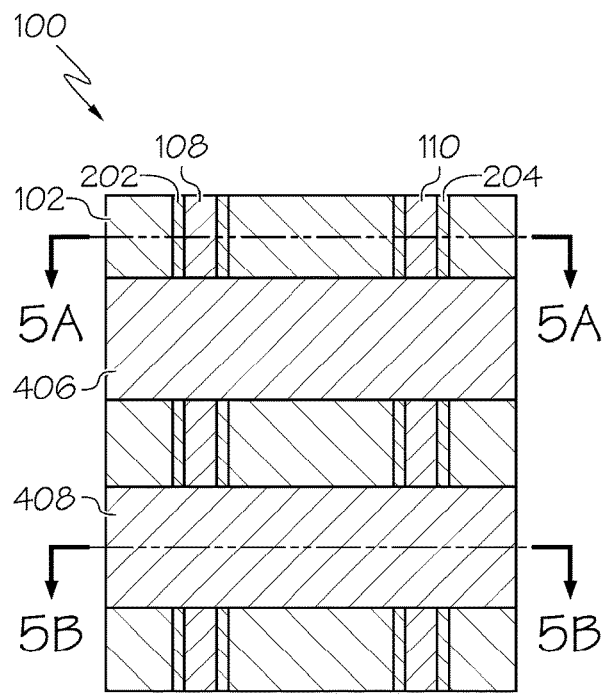
FIG. 5 is a plain view of the semiconductor device structure after portions of the second spacer not underlying the cut mask have been removed from the fins according to one embodiment of the present invention.
Figure 5A:
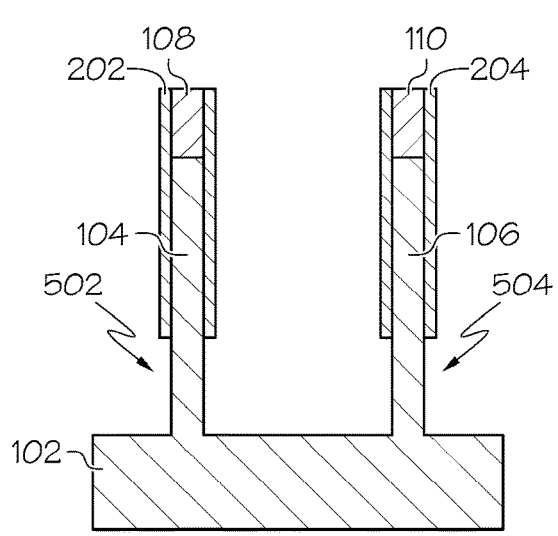
FIGS. 5A and 5B are a cross-sectional views of the semiconductor device structure after portions of the second spacer not underlying the cut mask have been removed from the fins according to one embodiment of the present invention.
Figure 5B:
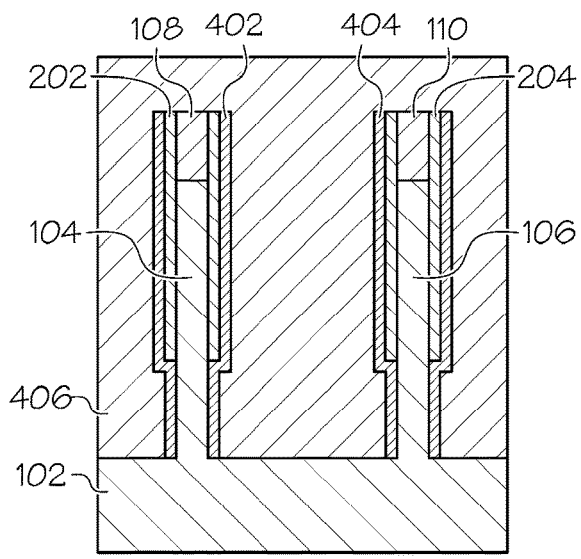
Figure 6:
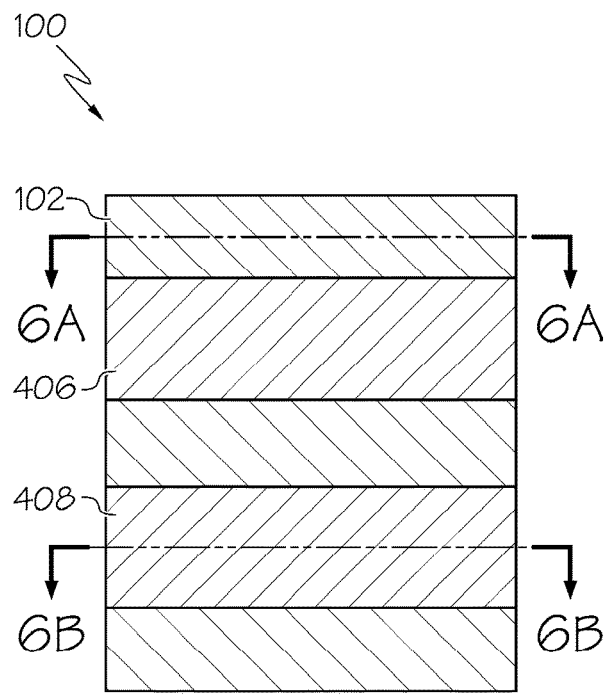
FIG. 6 is a plain view of the semiconductor device structure after portions of the first spacer not underlying the cut mask have been removed from the fins according to one embodiment of the present invention.
Figure 6A:
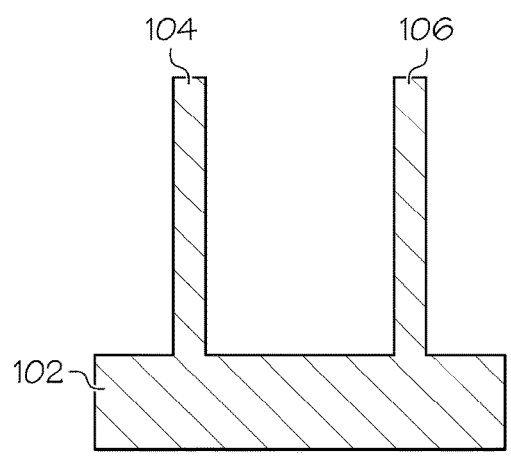
FIGS. 6A and 6B are a cross-sectional views of the semiconductor device structure after portions of the first spacer not underlying the cut mask have been removed from the fins according to one embodiment of the present invention.
Figure 6B:
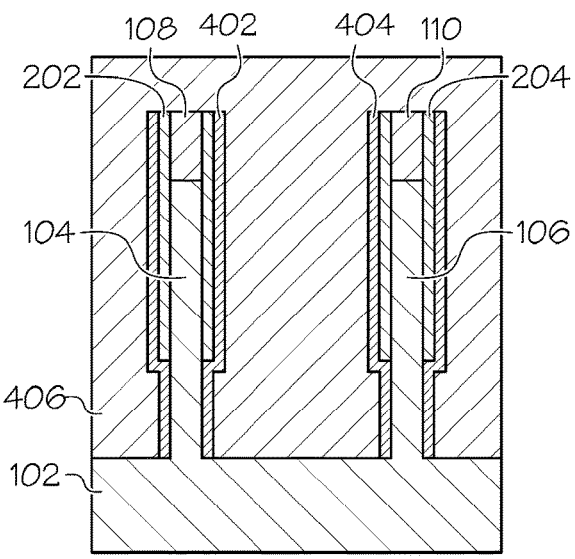

An isotropic etch may then be performed to remove the second spacer 402, 404 from the exposed fin portions as shown in FIGS. 5 to 5B. The removal of the second spacer 402, 404 exposes a top surface of the hard mask 108, 110; a top surface of the first spacer 202, 204; sidewalls of the first spacer 202, 204; a bottom surface of the first spacer 202, 204; and sidewalls of a lower region 502, 504 of the exposed fin portions within the fin cut regions 410 to 414. FIGS. 6 to 6B show that after the second spacer 402, 404 has been removed from the exposed fin portions, another isotropic etch may be performed to selective etch the exposed portions of the first spacer 202, 204. This process exposes portions of the semiconductor fins 104, 106 that will be cut. The fin hard masks 108, 110 in the fin cut region(s) may then be stripped.

Figure 7:
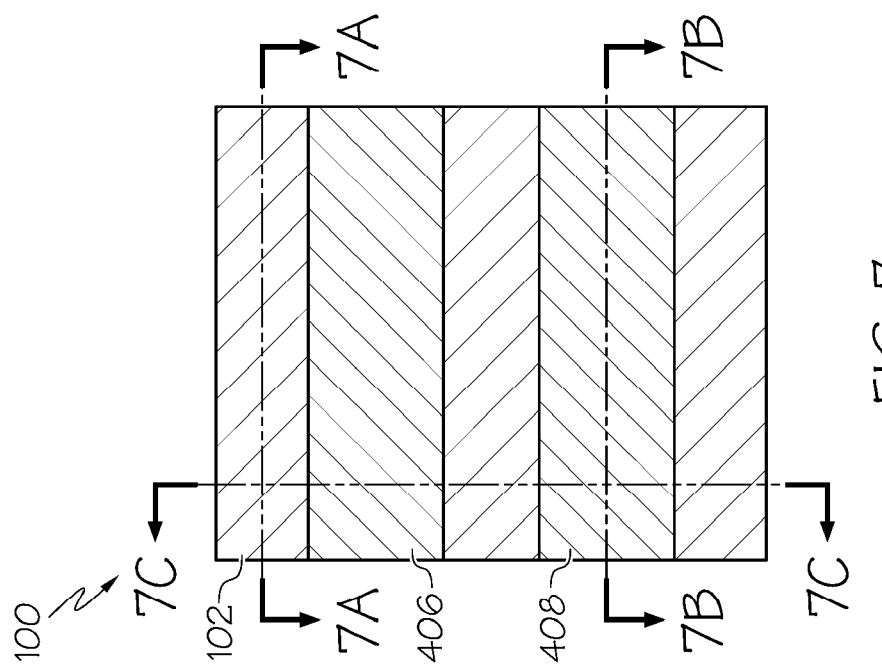
FIG. 7 is a plain view of the semiconductor device structure after exposed portions of the fins not underlying the cut mask have been etched away according to one embodiment of the present invention.
Figure 7A:
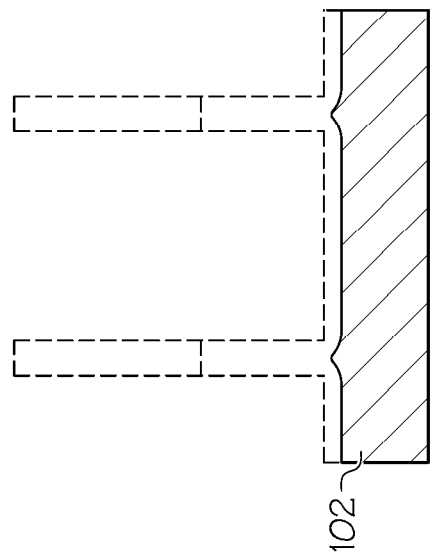
FIGS. 7A to 7C are a cross-sectional views of the semiconductor device structure after exposed portions of the fins not underlying the cut mask have been etched away according to one embodiment of the present invention.
Figure 7C:
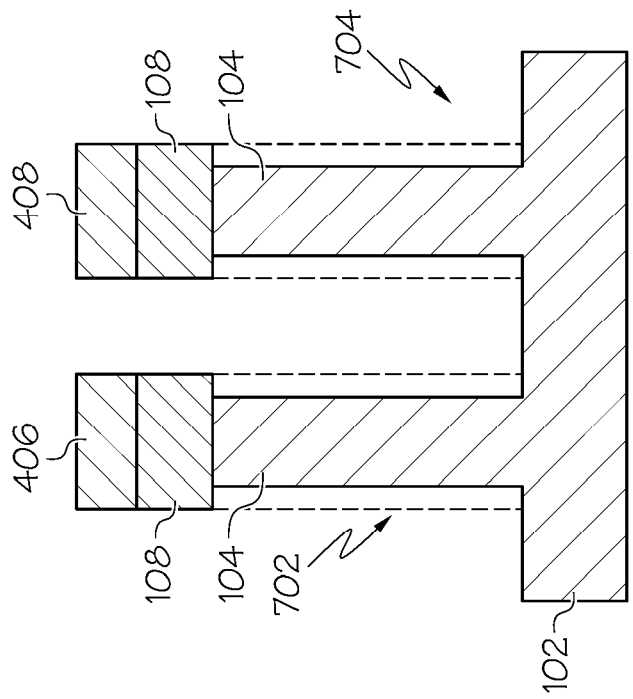
Figure 7B:
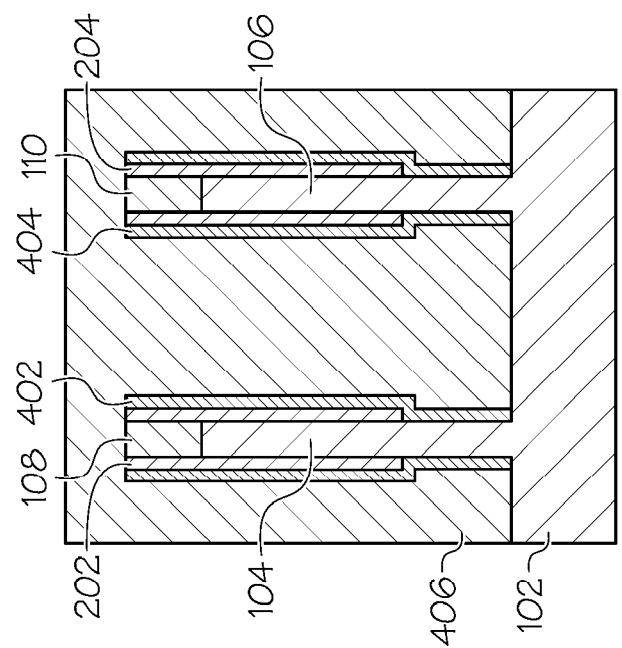

FIGS. 7 to 7C show that an isotropic etch of the fins 104, 106 may then be performed. This process removes the exposed portions of the fins 104, 106 within the fin cut regions as shown in FIG. 7A and indicated by the dashed lines. FIG. 7A also shows that a portion of the substrate 102 may be recessed as well. In at least some embodiments, a 5 nm silicon etch is sufficient to remove 8 nm fins (e.g., 5 nm from each side of fin) where, for example, a 20% due to loading effect only results in a 1 nm variation. The etching process may also recess exposed ends 702, 704 of the fins 104, 106 underlying the cut mask 406, 408 as shown in FIG. 7C and indicated by the dashed lines.

At this point in the fabrication process, cutting fins after the fin recess may cause various problems. For example, in-situ doped epitaxy may undesirably grow at fin ends thereby creating electrical short between top source/drain and bottom S/D. It is not trivial to seal fin ends by a dielectric without undesirably having the dielectric covering the lower portion of the fin. In addition, recessing fins in the fin cut region by RIE suffers from local loading effect. Therefore, one or more embodiments form a liner only at fin ends while keeping the lower portion of the fins exposed and ready for bottom source/drain epitaxy.

For example, FIGS. 8 to 8C show that after the fins 104, 106 are cut a liner 802, 804 may be formed to seal the fin ends 702, 704. For example, FIG. 8C shows that the recessed fin ends 702, 704 are sealed by liner 802, 804. The end liner 802, 804 may be formed by one or more spacer formation techniques. For example, the end liner 802, 804 may be formed by isotropically depositing a conformal layer of insulating material (e.g., silicon oxide, silicon nitride, silicon oxynitride, high-k dielectric material, and/or the like) followed by an anisotropic etch (e.g., reactive ion etch (RIE)) of that material to form spacers only on the fin ends 702, 704. After the end liner 802, 804 has been formed on the fin ends 702, 704, the fin cut masks 406, 408 may then be stripped away using one or more etching processes. The removal of the cut masks 406, 408 exposes underlying fin structures 806 to 812 that remained after exposed were cut from the original fin structures 104, 106. Each of the fin structures 806 to 812 comprises the hardmask 108, 110; first spacer 202, 204; second spacer 402, 404; and fin end liners 802, 804 as shown in FIGS. 8 to 8C.

Figure 9C:
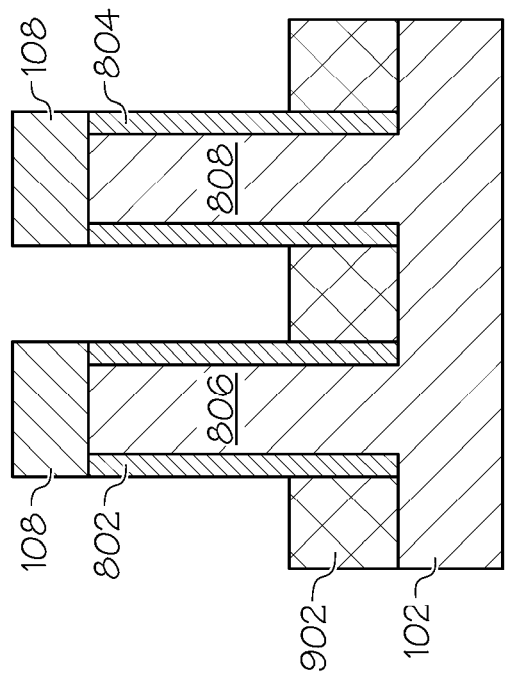
Figure 9B:
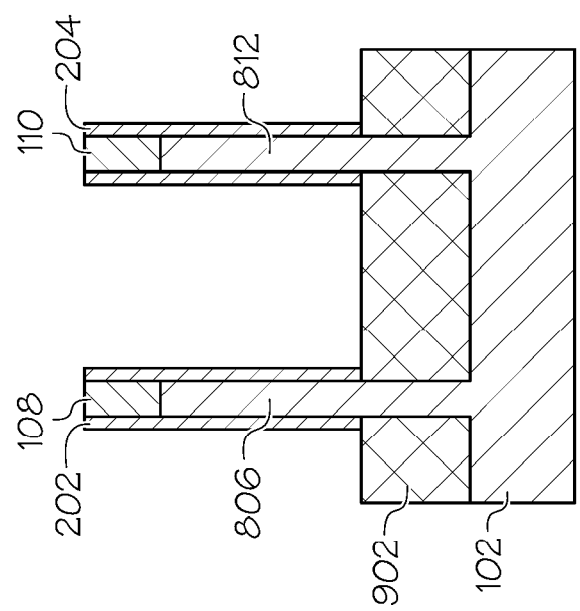

FIGS. 9 to 9C show that after the cut masks 406, 408 have been removed the second spacer 402, 404 may also be removed from the fins 806 to 812. A bottom source/drain 902 may then be formed. The second spacer 402, 404 may be removed, for example, by using an isotropic etching process resulting in the bottom portion of the fins 806 to 812 being exposed while the top portion of the fins 806 to 812 remain protected by the first spacer/liner 202, 204. The bottom source/drain layer 902 may either be a source layer or a drain layer and is formed in contact with the substrate 102, the exposed bottom portions of the fins 806 to 812; a bottom surface of the first spacer/liner 202, 204; and a portion of the end liner 802, 804.

Example materials for the bottom source/drain layer 902 include (but are not limited to) phosphorus doped silicon epitaxy for an NFET device and boron doped silicon germanium epitaxy for a PFET device. In one embodiment, the bottom source/drain layer 902 may have a thickness of about 10 nm to about 100 nm. However, other thicknesses are applicable as well. The bottom source/drain layer 902 may be doped with dopant atoms. The dopant atoms may be an n-type dopant (i.e., an element from Group V of the Periodic Table of Elements) or a p-type dopant (i.e., an element from Group III of the Periodic Table of Elements). Examples of n-type dopants for a group IV semiconductor include phosphorus, arsenic and antimony. Examples of p-type dopants for a group IV semiconductor include boron, aluminum, and gallium. Examples of n-type dopants for a III-V semiconductor include selenium, tellurium, silicon, and germanium. Examples of p-type dopants for a III-V semiconductor include beryllium, zinc, cadmium, silicon, and germanium.

In some embodiments, the bottom source/drain layer 902 is formed by epitaxial growth of a semiconductor material.

The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

Figure 10C:
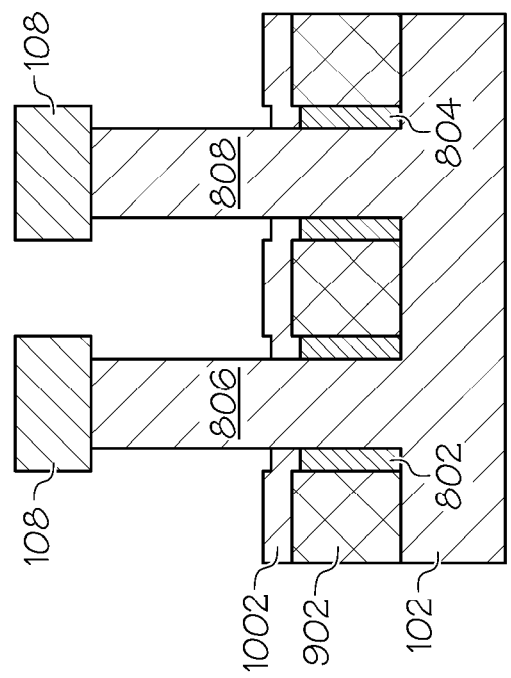
Figure 10B:
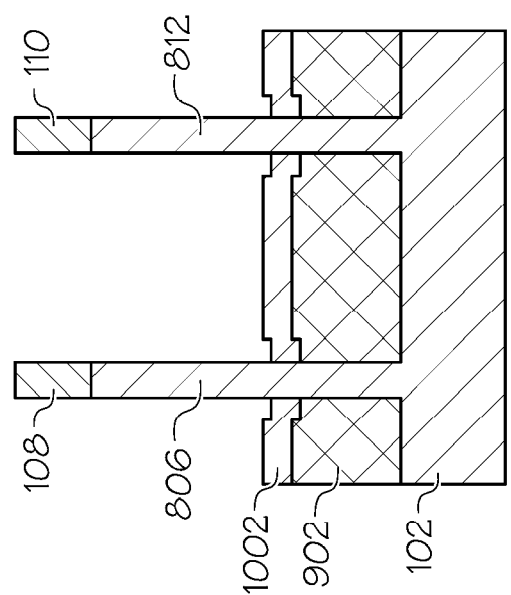

FIGS. 10 to 10C show that a bottom spacer layer 1002 may be subsequently formed on and in contact with the bottom source/drain layer 902. For example, one or more etching processes may be used to remove the first spacer/liner 202, 204 from the fins 806 to 812 and a portion of the end liner 802, 804. The end liner 802, 804 may be recessed down to or below a top surface of the bottom source/drain layer 902. Then, the bottom spacer layer 1002 may be formed in contact with a top surface of the bottom source/drain layer 902; sidewalls of the fins 806 to 812; and a top surface of the end liner 802, 804. In one embodiment, the bottom spacer layer 1002 may include an insulating material (such as silicon oxide, silicon nitride, silicon oxynitride, or a combination of these) and is formed using any non-conformal deposition process such as, for example, high density plasma (HDP) and physical vapor deposition (PVD) and subsequent etching techniques. The deposited spacer material may then be subsequently etched to form the final spacer structure. As shown, the fin end liner 802, 804 remains at the lower portion of the fin ends. This feature minimizes the impact of epi at fin ends to junction formation thereby improving junction (doping diffusion) uniformity. Otherwise, during the subsequent dopant drive-in anneal to form the junction the fin end may have more dopants from epitaxy and create shorter effective gate length than the remaining portion of the fin.

Figure 11:
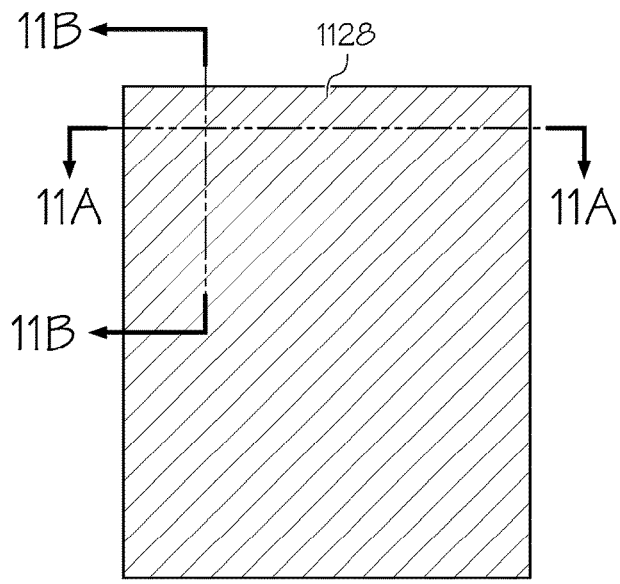
FIG. 11 is a plain view of the semiconductor device structure after additional features of the structure have formed according to one embodiment of the present invention.
Figures 11A, 11B:
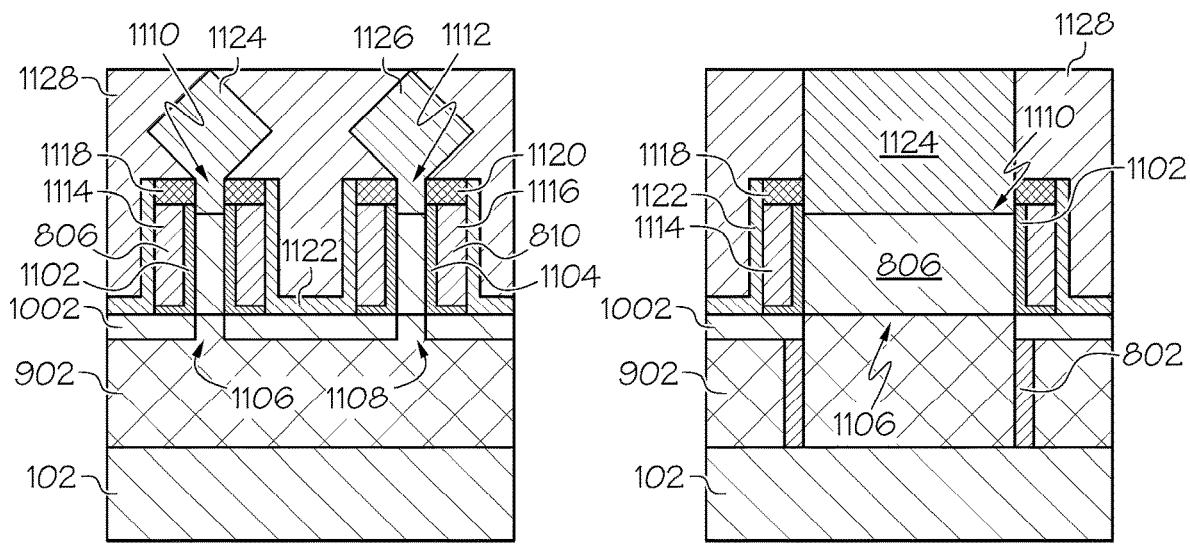
FIGS. 11A and 11B are a cross-sectional views of the semiconductor device structure after additional features of the structure have formed according to one embodiment of the present invention.

FIGS. 11 to 11B show that after formation of the bottom spacer layer 1002, an insulating layer 1102, 1104 is formed in contact with and surrounding a portion of the fin sidewalls and a top surface of the bottom spacer layer 1002. The insulating layer 1102, 1104 may be formed by depositing a thin conformal layer over the structure by, for example, CVD, PECVD, or ALD. In one embodiment, the insulating layer 1102 may be a high-k dielectric layer. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The insulating layer 1102, 1104 may further include dopants such as lanthanum or aluminum.

After formation of the insulating layer 1102, 1104, an annealing process may be performed to form bottom source/drain junctions 1106 to 1112 within a portion of the fins 806 to 812. In one or more embodiments, an annealing process may be conducted after the formation of the bottom source/drain layer 902 in order to push the bottom junctions 1106 and 1108 further into the fins 806 to 812. A thermal anneal process such as laser anneal, flash anneal, rapid thermal anneal (RTA), furnace anneal, or any suitable combination of those annealing techniques may be performed. In some embodiments, the junctions 1106 to 1112 may have a height of, for example, 4 nm to 10 nm. Although other dimensions are applicable as well. The top surface of the bottom junctions 1106, 1108 may be below, above, or stop at the top surface of the bottom spacer layer.

FIG. 11 further shows that one or more conductive gate layers 1114, 1116 may be formed in contact with and surrounding the vertical sidewalls of the insulating layer 1102, 1104, and may also be in contact with a top surface of insulating layer portions that are in contact with the bottom spacer layer 1002. In one embodiment, the conductive gate layers 1114, 1116 may be formed by depositing one or more conductive materials over the structure. The insulating layer 1102, 1104 and conductive gate layers 1114, 1116 form a gate structure. If the structure comprises both PFET and NFET devices, PFET conductive materials may first be deposited. The PFET device may then be masked off and one or more NFET conductive materials are deposited over the entire structure. The masking layer is then removed from the PFET device. In other embodiments, the NFET device may be masked off during deposition of the PFET gate layers.

Examples of conductive gate materials include (but are not limited to) polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive gate material may further comprise dopants that are incorporated during or after deposition.

The conductive gate material may comprise multiple layers such as gate work function setting layer (work function metal) and/or a conductive gate layer. The work function metal be deposited employing CVD, sputtering, or plating. The work function metal layers may comprise one or more metals having a function suitable to tune the work function of NFETs or PFETs. In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer can be a TiN/TiC stack. The insulating layer 1102, 1104 and conductive gate layers 1114, 1116 may be conformally deposited on the bottom spacer layer 1002 and on and around the fins 806 and 810 including the hardmasks 108 and 110 shown in FIG. 10B. An isotropic etch may be performed to recess the gate structure, including the insulating layer 1102, 1104 and conductive gate layers 1114, 1116.

A top spacer 1118, 1120 may be formed on and in contact with the top surface of the conductive gate layers 1114, 1116; the top surface of the insulating layers 1102, 1104. The top surface of the spacer 1118, 1120 may be co-planar with the top surfaces of the fins 806 to 812. In one embodiment, the top spacer 1118, 1120 may comprise the same or different material as the bottom spacer layer 1002. For example, the top spacer 1118, 1120 may comprise an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structure.

An encapsulation layer 1122 such as (but not limited to) silicon nitride may then formed over the structure using a conformal deposition process. During the following top source/drain layer formation process, one or more etching processes may be performed to remove the encapsulation layer material from the top surface of the top spacer 1118, 1120 and the top junctions 1110, 1112 formed within the fins 806 to 812.

A dielectric layer (shown as part of layer 1128) may then be formed on the recessed gate structures, including the top spacer 1118 and 1120, and region between two devices. The dielectric layer 1128, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Planarization, for example, CMP can be performed to remove excess material from layer 1128. The planarization can be performed down to the hard masks 108 and 110 shown in FIG. 10B.

The hard masks 108, 110 may be selectively removed by, for example, RIE which stops on the fin structures 104, 106. Top source/drains 1124, 1126 may then be formed in contact with at least the top source/drain junctions 1110, 1112. The top source/drains 1124, 1126 may be formed using an epitaxy process. For example, selective epitaxy may be used to grow material from the exposed top source/drain junctions 1110, 1112 to form the top source/drain layers 1124, 1126. The top source/drain layers 1124, 1126 may either be a source layer or a drain layer and may comprise in-situ doping (boron, in one embodiment for PFET and phosphorus, in one embodiment, for NFET). It should be noted that, according to one embodiment, the top source/drain layers 1124, 1126 may not contain any doping. Doping may be performed using any standard approach such as ion implantation. In particular, due to the slower growth rates on (111) orientated surface during the epitaxial growth so that faceted top source/drain layers 1124, 1126 are obtained. As shown in FIG. 11, the top source/drain layers 1124, 1126 comprise angled sides. In some embodiments, the top/source drain layers 1124, 1126 comprise a diamond shape. The epitaxial growth of diamond shaped epitaxy is self-limiting to the outer <111> plane resulting in diamond outer periphery. It should be noted that, non-faceted epitaxy and/or multiple epitaxy steps can be used to form the top source/drain layers 1124, 1126 without limiting the scope of the present disclosure. It should also be noted that, in some embodiments, the top/source drain layers 1124, 1126 may be merged.

In one or more embodiments, an annealing process may be conducted after the formation of the top source/drain layer 1124 and 1126 in order to push the top junctions 1110 and 1112 further into the fins 806. A thermal anneal process such as laser anneal, flash anneal, rapid thermal anneal (RTA), furnace anneal, or any suitable combination of those annealing techniques can be performed. In some embodiments, the junctions 1106 to 1112 may have a height of, for example, 4 nm to 10 nm. Although other dimensions are applicable as well. The bottom surface of the top junctions 1110, 1112 may be above, below, or stop at the insulating layer 1102, 1104.

An additional dielectric 1128 may then be formed over the entire structure. The dielectric layer 1128, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

The dielectric layer 1128 may be patterned and etched to form one or more contact openings/trenches (not shown) to exposed the top source/drain layers 1124, 1126. One or more contact metal/metallic layers (not shown) may then be formed within the contact opening(s). The contact metal/metallic layers may fill the contact opening(s) and contact the top surface of the source/drain layers 1124, 1126 (or any liner and/or the silicide formed thereon). The contact metal layer(s), in one embodiment, may comprise tungsten (W), titanium (Ti), tantalum (Ta), TiN, hafnium (Hf), zirconium (Zr), niobium (Nb), or alloys comprising carbon. However, other materials are applicable as well.

Figure 12:
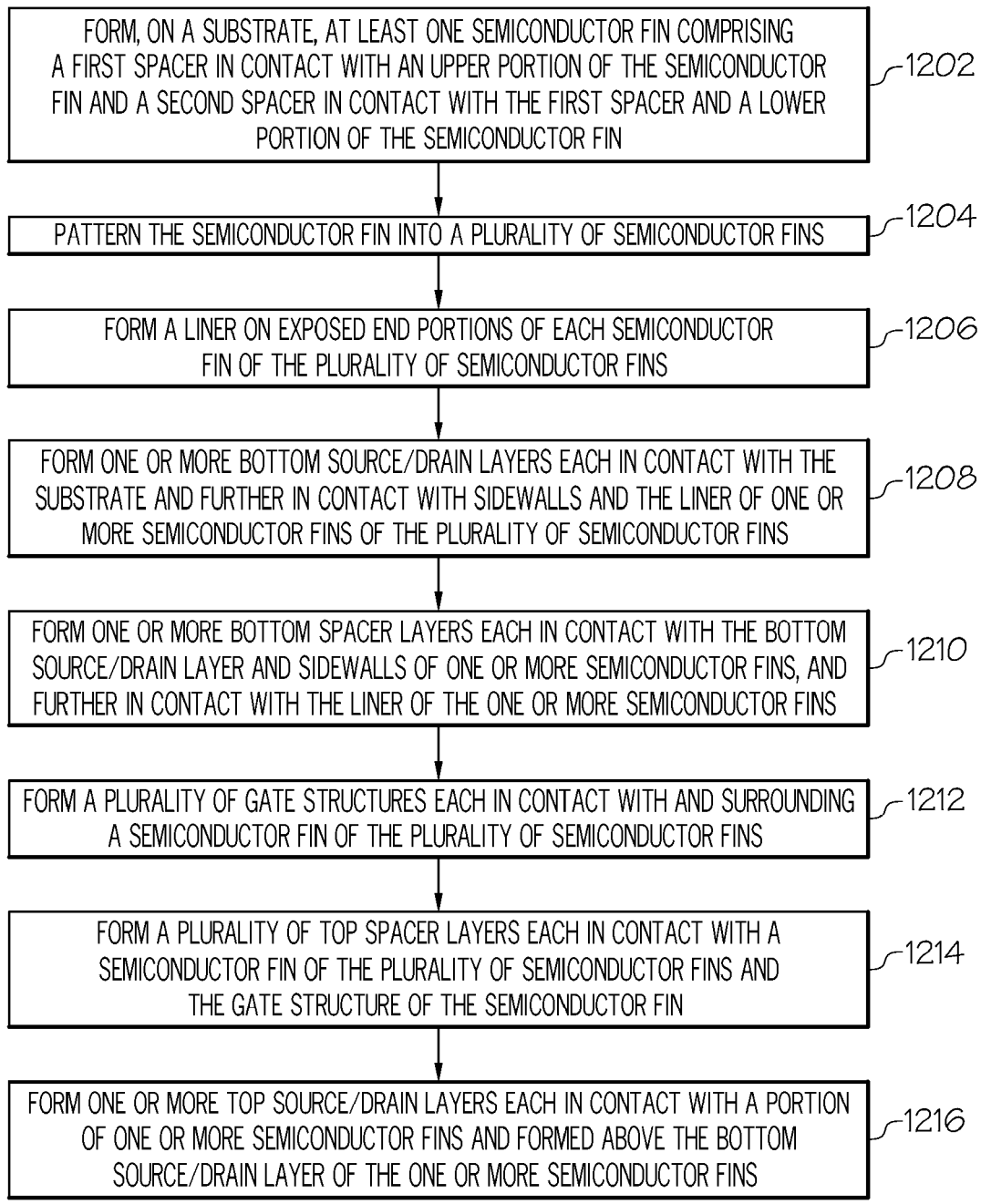
FIG. 12 is an operational flow diagram illustrating one example of a process for forming vertical field effect transistors with improved uniformity according to one embodiment of the present invention.

FIG. 12 is an operational flow diagram illustrating one example of a process for forming vertical field effect transistors with improved uniformity. It should be noted that each of the steps shown in FIG. 9 has been discussed in greater detail above with respect to FIGS. 1 to 11B. At least one semiconductor fin comprising a first spacer in contact with an upper portion of the semiconductor fin and a second spacer in contact with the first spacer and a lower portion of the semiconductor fin is formed on a substrate, at step 1202. The semiconductor fin is patterned into a plurality of semiconductor fins, at step 1204. A liner is formed on exposed end portions of each semiconductor fin of the plurality of semiconductor fins, at step 1206.

One or more bottom source/drain layers are formed with each bottom source/drain layer in contact with the substrate and further in contact with sidewalls and the liner of one or more semiconductor fins of the plurality of semiconductor fins, at step 1208. One or more bottom spacer layers are formed with each bottom spacer layer in contact with the bottom source/drain layer and sidewalls of one or more semiconductor fins, and further in contact with the liner of the one or more semiconductor fins, at step 1210. A plurality of gate structures is formed with each gate structure in contact with and surrounding a semiconductor fin of the plurality of semiconductor fins, at step 1212. A plurality of top spacer layers is formed with each top spacer layer in contact with a semiconductor fin of the plurality of semiconductor fins and the gate structure of the semiconductor fin, at step 1214. One or more top source/drain layers are formed with each top source/drain layer in contact with a portion of one or more semiconductor fins and formed above the bottom source/drain layer of the one or more semiconductor fins.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A semiconductor device structure comprising at least:
   a semiconductor fin;
   a liner in contact with end portions of the semiconductor fin;
   a first source/drain in contact with the liner and sidewalls of the semiconductor fin;
   a gate structure in contact with and surrounding the semiconductor fin; and
   a second source/drain formed above the first source/drain.

2. The semiconductor device structure of claim 1, wherein the liner comprises a top surface below a top surface of the semiconductor fin.

3. The semiconductor device structure of claim 1, wherein a top surface of the first source/drain and a top surface of the liner are co-planar.

4. The semiconductor device structure of claim 1, wherein the first source/drain is formed in contact with a top surface of a substrate.

5. The semiconductor device structure of claim 1, further comprising:

a first spacer layer in contact with at least the first source/drain, wherein the gate structure is formed on top of the first spacer layer; and
   a second spacer layer formed above the first spacer layer and in contact with at least a top surface of the gate structure.

6. The semiconductor device structure of claim 1, further comprising:
   a bottom source/drain junction formed within a bottom portion of the semiconductor fin and in contact with at least the first source/drain; and
   a top source/drain junction formed within an upper portion of the semiconductor fin and in contact with at least the second source/drain.

7. The semiconductor device structure of claim 1, wherein the second source/drain comprises one or more faceted regions.

8. An integrated circuit comprising:
   at least one vertical field effect transistor, wherein the at least one vertical field effect transistor comprises at least:
      a semiconductor fin;
      a liner in contact with end portions of the semiconductor fin;
      a first source/drain in contact with the liner and sidewalls of the semiconductor fin;
      a gate structure in contact with and surrounding the semiconductor fin; and
      a second source/drain formed above the first source/ drain.

9. The integrated circuit of claim 8, wherein the liner comprises a top surface below a top surface of the semiconductor fin.

10. The integrated circuit of claim 8, wherein a top surface of the first source/drain and a top surface of the liner are co-planar.

11. The integrated circuit of claim 8, wherein the first source/drain is formed in contact with a top surface of a substrate.

12. The integrated circuit of claim 8, wherein the at least one vertical field effect transistor further comprises:
   a first spacer layer in contact with at least the first source/drain, wherein the gate structure is formed on top of the first spacer layer; and
   a second spacer layer formed above the first spacer layer and in contact with at least a top surface of the gate structure.

13. The integrated circuit of claim 8, wherein the at least one vertical field effect transistor further comprises:
   a bottom source/drain junction formed within a bottom portion of the semiconductor fin and in contact with at least the first source/drain; and
   a top source/drain junction formed within an upper portion of the semiconductor fin and in contact with at least the second source/drain.

14. A semiconductor device structure comprising at least:
   a semiconductor fin comprising recessed end portions;
   a liner in contact with the recessed end portions of the semiconductor fin;
   a first source/drain in contact with the liner and sidewalls of the semiconductor fin;
   a gate structure in contact with and surrounding the semiconductor fin; and
   a second source/drain formed above the first source/drain.

15. The semiconductor device structure of claim 14, wherein the liner comprises a top surface below a top surface of the semiconductor fin.

16. The semiconductor device structure of claim 14, wherein a top surface of the first source/drain and a top surface of the liner are co-planar.

17. The semiconductor device structure of claim 14, wherein the first source/drain is formed in contact with a top surface of a substrate.

18. The semiconductor device structure of claim 14, further comprising:
- a first spacer layer in contact with at least the first source/drain, wherein the gate structure is formed on top of the first spacer layer; and
- a second spacer layer formed above the first spacer layer and in contact with at least a top surface of the gate structure.

19. The semiconductor device structure of claim 14, further comprising:
- a bottom source/drain junction formed within a bottom portion of the semiconductor fin and in contact with at least the first source/drain; and
- a top source/drain junction formed within an upper portion of the semiconductor fin and in contact with at least the second source/drain.

20. The semiconductor device structure of claim 14, wherein the second source/drain comprises one or more faceted regions.

* * * * *